(12) United States Patent
Chen

(10) Patent No.: US 11,733,597 B1
(45) Date of Patent: Aug. 22, 2023

(54) HEAT RADIATING DEVICE OF LCD PROJECTOR

(71) Applicant: Changsha Pujiade Photoelectric Technology Co., Ltd, Changsha (CN)

(72) Inventor: Ling Chen, Changsha (CN)

(73) Assignee: Changsha Pujiade Photoelectric Technology Co., Ltd, Changsha (CN)

( * ) Notice: Subject to any disclaimer, the term of this patent is extended or adjusted under 35 U.S.C. 154(b) by 0 days.

(21) Appl. No.: 18/056,703

(22) Filed: Nov. 17, 2022

(30) Foreign Application Priority Data

Mar. 9, 2022 (CN) .......................... 202210225360.6

(51) Int. Cl.
*G03B 21/16* (2006.01)
*G03B 21/00* (2006.01)
*H05K 7/20* (2006.01)
*G03B 21/20* (2006.01)

(52) U.S. Cl.
CPC ........... *G03B 21/16* (2013.01); *G03B 21/006* (2013.01); *G03B 21/2033* (2013.01); *H05K 7/20145* (2013.01); *H05K 7/20154* (2013.01)

(58) Field of Classification Search
None
See application file for complete search history.

(56) References Cited

U.S. PATENT DOCUMENTS

2018/0143518 A1* 5/2018 Tsai ................. G02B 27/0006

FOREIGN PATENT DOCUMENTS

| CN | 212540990 U | 2/2021 |
| CN | 113156754 A | 7/2021 |
| CN | 113448156 A | 9/2021 |

* cited by examiner

*Primary Examiner* — Richard H Kim

(57) ABSTRACT

The present invention discloses a heat radiating device of an LCD projector, and the LCD projector has a fully sealed optical machine. The heat radiating device comprises an LED light source radiator, an efficient heat exchanger, external fans and an air guide cover. A window used for installing the efficient heat exchanger is formed in the bottom of a shell of the fully sealed optical machine. The efficient heat exchanger comprises a buckled Fin at a high temperature heat absorption side, a partition plate and sunflower sectional materials at a low temperature heat release side; and the buckled Fin, the partition plate and the sunflower sectional materials are sequentially pasted. The buckled Fin is located on an internal heat radiating air channel of the fully sealed optical machine; and the partition plate is formed in the bottom of the shell of the fully sealed optical machine.

5 Claims, 9 Drawing Sheets

HEAT RADIATING DEVICE OF LCD PROJECTOR

CROSS REFERENCE TO RELATED APPLICATIONS

This application claims foreign priority of Chinese Patent Application No. 202210225360.6, filed on Mar. 9, 2022 in the China National Intellectual Property Administration, the disclosures of all of which are hereby incorporated by reference.

TECHNICAL FIELD

The present invention relates to the technical field of projectors, and particularly relates to a heat radiating device of an LCD (Liquid Crystal Display) projector.

BACKGROUND OF THE PRESENT INVENTION

In recent years, an optical system is sealed by an increasing number of single-LCD projectors to form a fully sealed optical machine, so as to overcome a very big defect existing in the previous product, namely, the quality of the product is greatly influenced by dust, and the durability of the optical property is poor due to the deposition of the dust. Since the main input electric power of the single-LCD projectors becomes joule heat, the heat radiating technology of the fully sealed optical machine is still a difficult universal problem in the industry.

A "closed semi-vertical type LCD projection optical machine" described in a Chinese patent with the Publication Number CN113156754A, which is a representative product having the advanced technology currently, and "an air return heat exchange system and a sealed optical machine of a projector" in a Chinese patent with the Publication Number CN113448156A, which is an innovative product, can be referred to. However, the heat radiating capacity of the products still has too many problems to deal with, which seriously affects their market performance and user experience.

SUMMARY OF PRESENT INVENTION

Based on the above problems, the present invention aims to further remarkably enhance the heat radiating level of a fully sealed optical machine through technical innovation, so as to remarkably enhance output brightness and durability of a projector and reduce operation noise of the projector. Based on the fully sealed optical machine produced for a heat radiating device provided by the present invention, the projector product can obtain better market performance and user experience.

In order to achieve the above purposes, the present invention provides a heat radiating device of an LCD projector, and the LCD projector has a fully sealed optical machine. The heat radiating device comprises an LED light source radiator, an efficient heat exchanger, external fans and an air guide cover. A window used for installing the efficient heat exchanger is formed in the bottom of a shell of the fully sealed optical machine. The efficient heat exchanger comprises a buckled Fin at a high temperature heat absorption side, a partition plate and sunflower sectional materials at a low temperature heat release side; and the buckled Fin, the partition plate and the sunflower sectional materials are sequentially pasted. The buckled Fin is located on an internal heat radiating air channel of the fully sealed optical machine; and the partition plate is used for sealing the window used for installing the efficient heat exchanger and formed in the bottom of the shell of the fully sealed optical machine. Air inlets of the external fans are opposite to the sunflower sectional materials, and an interval is left between each external fan and each sunflower sectional material. Air outlets of the external fans are opposite to the LED light source radiator. The air guide cover is used for sealing the interval between the air inlet of each external fan and each sunflower sectional material and forming a first air channel in an enclosing manner. The air guide cover is used for sealing an interval between the air outlet of each external fan and the LED light source radiator and forming a second air channel in an enclosing manner.

Preferably, each external fan is a turbofan.

Preferably, the rib surface type of each sunflower sectional material is in an involute spiral shape.

Preferably, the involute spiral direction of the rib surface of each sunflower sectional material is opposite to the rotation direction of each external fan.

Further, the number of the sunflower sectional materials is equal to the number of the external fans.

The present invention has the following positive effects:

The efficient heat exchanger in the present invention has performance indexes close to an ideal heat exchanger, so that the heat radiating effect of an LCD light valve is better; the product noise is lower, so as to allow the projector to output higher brightness and obtain better durability; and positive effects are achieved.

DESCRIPTION OF THE DRAWINGS

To more clearly describe the technical solutions in the embodiments of the present invention or in the prior art, the drawings required to be used in the description of the embodiments or the prior art will be simply presented below. Obviously, the drawings in the following description are merely some embodiments of the present invention, and for those ordinary skilled in the art, other drawings can also be obtained according to the drawings without contributing creative labor.

DETAILED DESCRIPTION OF PREFERRED EMBODIMENTS

Figure 1:
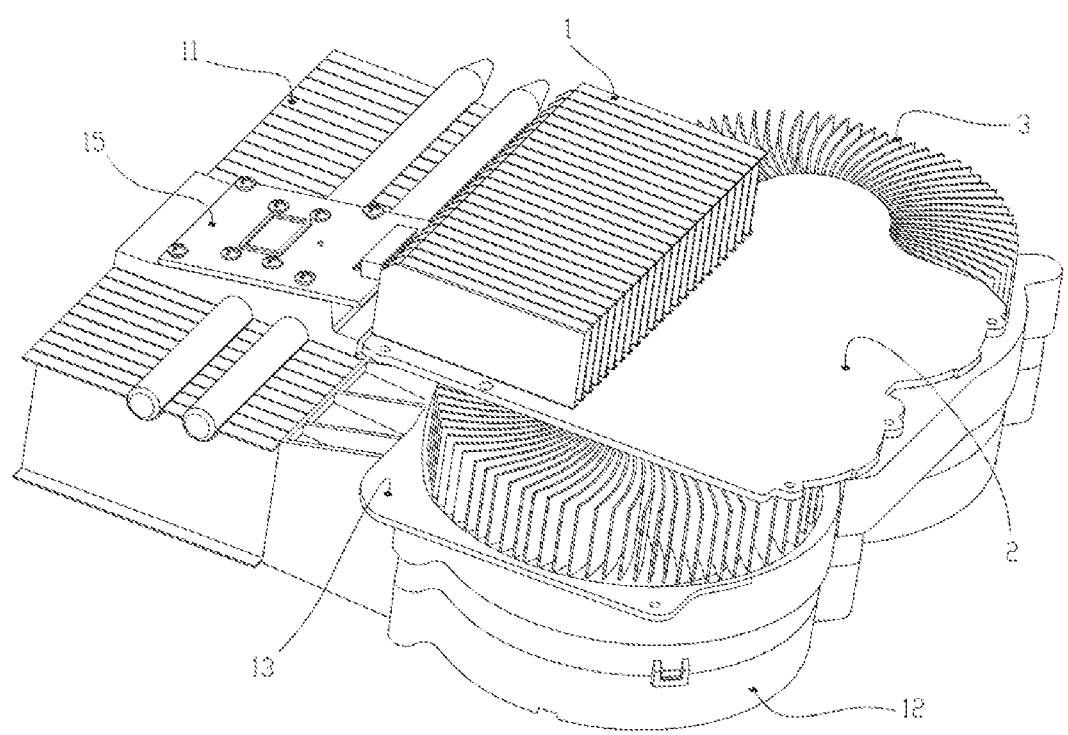
FIG. 1 is a schematic diagram of an embodiment of the present invention.

To better understand the technical solution of the present invention for those skilled in the art, the present invention will be explained below in detail in combination with the drawings. The description in this part is demonstrative and interpretative only and shall not limit the protection scope of the present invention.

It should be noted that similar reference signs and letters indicate similar items in the following drawings. Therefore, a certain item will not be further defined and explained in the subsequent drawings once defined in one drawing.

It should be noted that terms of "center", "upper", "lower", "left", "right", "vertical", "horizontal", "inner" and "outer" indicate direction or position relationships shown based on the drawings or direction or position relationships in which the product of the present invention is usually placed in use, and are only intended to facilitate the description of the present invention and the simplification of the description rather than to indicate or imply that the indicated device or element must have a specific direction or constructed and operated in a specific direction, and therefore, shall not be understood as a limitation to the present invention. In addition, the terms of "first", "second" and "third" are only used for distinguishing the descriptions, rather than being understood to indicate or imply relative importance.

In addition, the terms of "horizontal", "vertical" and "pendant" do not indicate that the component is required to be absolutely horizontal or pendant, but can be slightly tilted. For example, "horizontal" only means that the direction is more horizontal relative to "vertical", and does not mean that the structure must be completely horizontal, but can be slightly tilted.

It should be noted in the explanation of the present invention that, unless otherwise specifically regulated and defined, terms such as "arranged", "installation", "connected", and "connecting" shall be understood in broad sense, and for example, may refer to fixed connection or detachable connection or integral connection, may refer to mechanical connection or electrical connection, and may refer to direct connection or indirect connection through an intermediate medium or inner communication of two elements. For those ordinary skilled in the art, the specific meanings of the above terms in the present invention may be understood according to specific conditions.

Embodiment 1

A heat radiating system of a single-LCD projector, in particular to a heat exchanger of an optical machine, is not only a simple evaluation process of theoretically designing scientific principles such as an LMTD (Logarithmic Mean Temperature Difference) method, an ε-NTU (efficiency-Number of Transfer Units) method and the like to calculate heat flow, heat exchange area, fluid pressure, viscosity and the like through combination with fluid mechanics and optimize an acceptance or a rejection, but is designed scientifically and reasonably as much as possible and accords with the requirements of product positioning as much as possible in consideration of the product positioning, the cost performance and the degree of adaptation or damage of the heat radiating system to the ID (Industrial Design) of an original projector and under the situations of the conditions such as the limited size, space and cost.

Generally, in the technology at the present stage, heat radiating of a sealed optical machine of an LCD projector is implemented mainly by arranging one or more heat exchangers. Specifically, after forced air-cooling heat radiating is carried out on an LCD light valve inside the sealed optical machine, the heat of hot air accumulated inside the optical machine is transferred to a heat absorption part of the heat exchanger (inside the optical machine), is transmitted to a heat release part (outside the optical machine) through a partition plate (having the function of airtightness for the inside and the outside of the optical machine) and is diffused into atmosphere in a certain convection manner. Due to the comprehensive factors such as the size, the cost and the like, an air/air heat exchange manner is preferable in the industry generally.

An air/air heat exchanger generally comprises the following structural forms of heat exchange: a parallel-flow (also called concurrent flow in some industries) form, a counter-flow form, and a cross-flow form according to the relative flow direction of air at the heat absorption part/the heat release part. Under the above limited and equivalent conditions (such as the heat flow, the heat exchange area, the flow rate of the air, the temperature difference and the like), according to known knowledge and public knowledge, the heat exchange effect of the parallel-flow form is relatively poor, the heat exchange efficiency of the counter-flow form is relatively higher, and the efficiency of the cross-flow form is between the parallel-flow form and the counter-flow. The optical machine of the projector must obey travel setting conditions of a light path, namely, the heat distribution is sequentially decreased from a projection light source to a projection lens, so a parallel-flow form heat exchanger can only be arranged on a fully sealed optical machine more conveniently and faster often; and a representative product has the design of classic products, such as a Chinese patent with the Publication Number CN212540990U and the like, which is also a mainstream technology manner of the sealed optical machine currently. While in the above Chinese patent with the Publication Number CN113156754A, a heat exchanger of a fully sealed optical machine is in a cross-flow design. For a novel heat exchange manner, such as a product in the above Chinese patent with the Publication Number CN113448156A, can be understood as a "complex fluid" manner, which belongs to a more novel and more complex technical means and has unique advantages on a compact type projector and a product with smaller heat radiating burden; and since an "air return heat exchange pipe" can just be installed in a triangular region at the back of an imaging reflector, the volume of the optical machine is not additionally increased.

With reference to FIG. 1-FIG. 6, an embodiment of the present invention provides a heat radiating device of an LCD projector, and the LCD projector has a fully sealed optical machine 10. The heat radiating device comprises an LED light source radiator 11, an efficient heat exchanger 14, external fans 12 and an air guide cover 13, wherein the number of the external fans 12 in the embodiment is preferably but not limited to two; and the external fans 12 are preferably but not limited to turbofans, and two turbofans are installed side by side.

Figure 5:
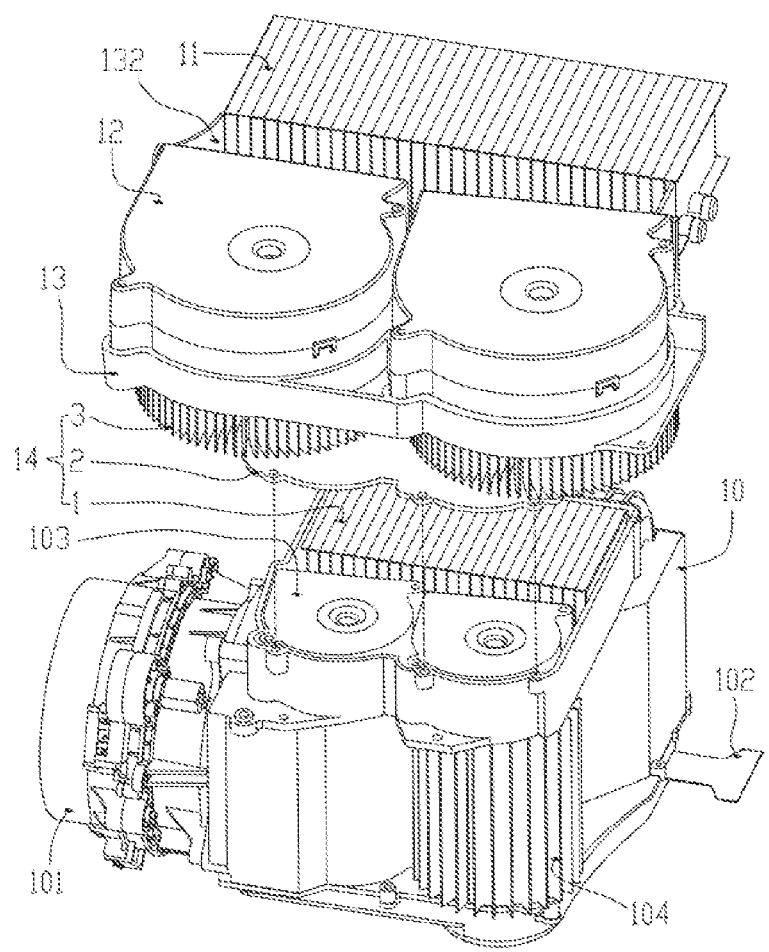
FIG. 5 is a display diagram of decomposition of the fully sealed optical machine and a heat radiating device in the embodiment of the present invention.

A window used for installing the efficient heat exchanger 14 is formed in the bottom of a shell of the fully sealed optical machine 10 (with reference to FIG. 5). The efficient heat exchanger 14 comprises a buckled Fin 1 (the Fin refers to a flipper piece and a rib piece, and the "buckled Fin"

represents a structural form that a flipper piece is stamped, which belongs to a term in the industry) arranged at the relatively high temperature side and used for absorbing heat, i.e. located inside the optical machine, a partition plate 2 and sunflower sectional materials 3 arranged at the relatively low temperature side and used for diffusing heat (or releasing heat), i.e. located outside the optical machine. In the embodiment, the number of the sunflower sectional materials 3 is preferably but not limited to two, two sunflower sectional materials 3 are arranged side by side, and each sunflower sectional material 3 is opposite to each external fan 12. The rib surface type of each sunflower sectional material 3 is in an involute spiral shape, and meanwhile, the involute spiral direction of the rib surface is preferably opposite to the rotation direction of each external fan 12. The above means are very beneficial to reduction of air draft resistance of the external fans 12 and increase of the heat exchange area of the unit volume of the sunflower sectional materials 3 (i.e. $m^2/m^3$) and are also very beneficial to improvement of flow losses of air at boundary layers of the rib surfaces. Through actual measurement, the external fans 12 in the embodiment are installed, compared with the air resistance (air pressure, air flow, flow rate and the like) of operation in a completely open environment state, the air resistance of the external fans 12 is only about 10% lower than the latter, the external fans 12 have excellent air resistance and noise indexes, and specific parameters of an involute spiral line are omitted.

The buckled Fin 1, the partition plate 2 and the sunflower sectional materials 3 are sequentially pasted, are specifically welded and fixed into one through high frequency tin soldering and are preferably but not limited to aluminum or aluminum alloy materials (nickel needs to be plated); and the capacity of heat transmission and the cost performance are higher, and the weight is not too large. The buckled Fin 1 is located on an internal heat radiating air channel of the fully sealed optical machine 10 and is opposite to air outlets of two turbofans 103 arranged inside the fully sealed optical machine 10 (with reference to FIG. 5); and the partition plate 2 is used for sealing the window used for installing the efficient heat exchanger 14 and formed in the bottom of the shell of the fully sealed optical machine 10. Air inlets of the two external fans 12 are opposite to the sunflower sectional materials 3 one to one. In the embodiment, a 9 mm-10 mm of interval is left between each external fan 12 and each sunflower sectional material 3, so as to be beneficial to design of a first air channel 131 and reduction of noise. Air outlets of the external fans 12 are opposite to the LED light source radiator 11.

Figure 2:
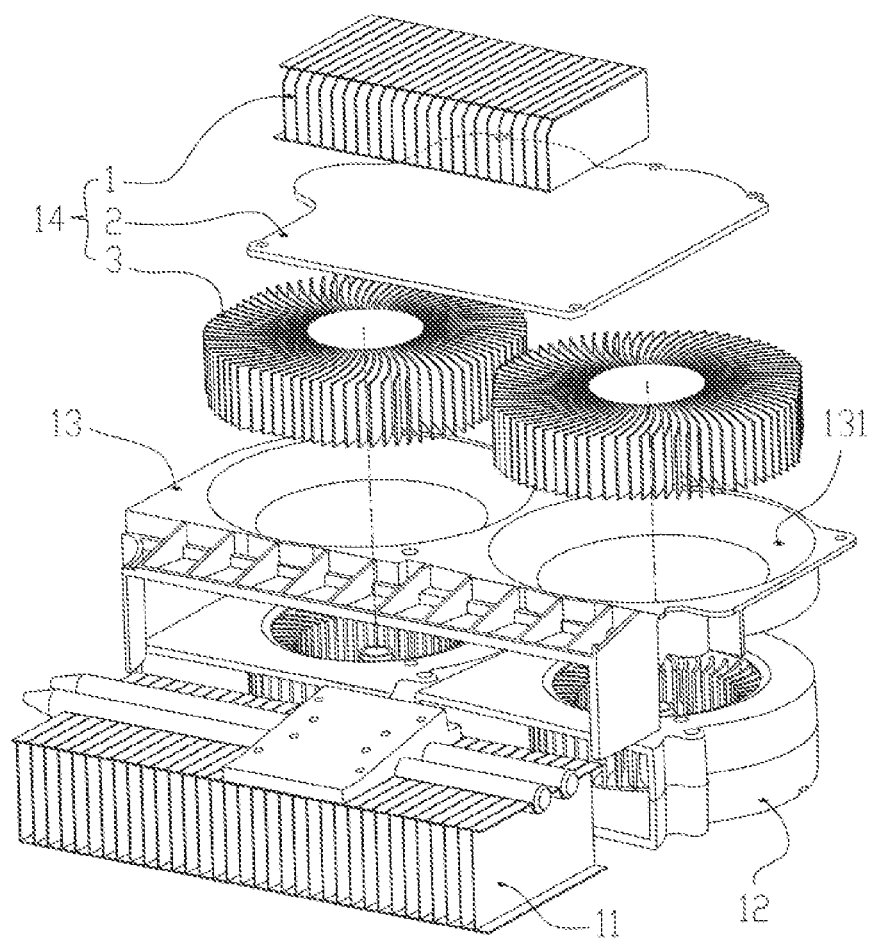
FIG. 2 is a schematic diagram of decomposition of the embodiment of the present invention.
Figure 3:
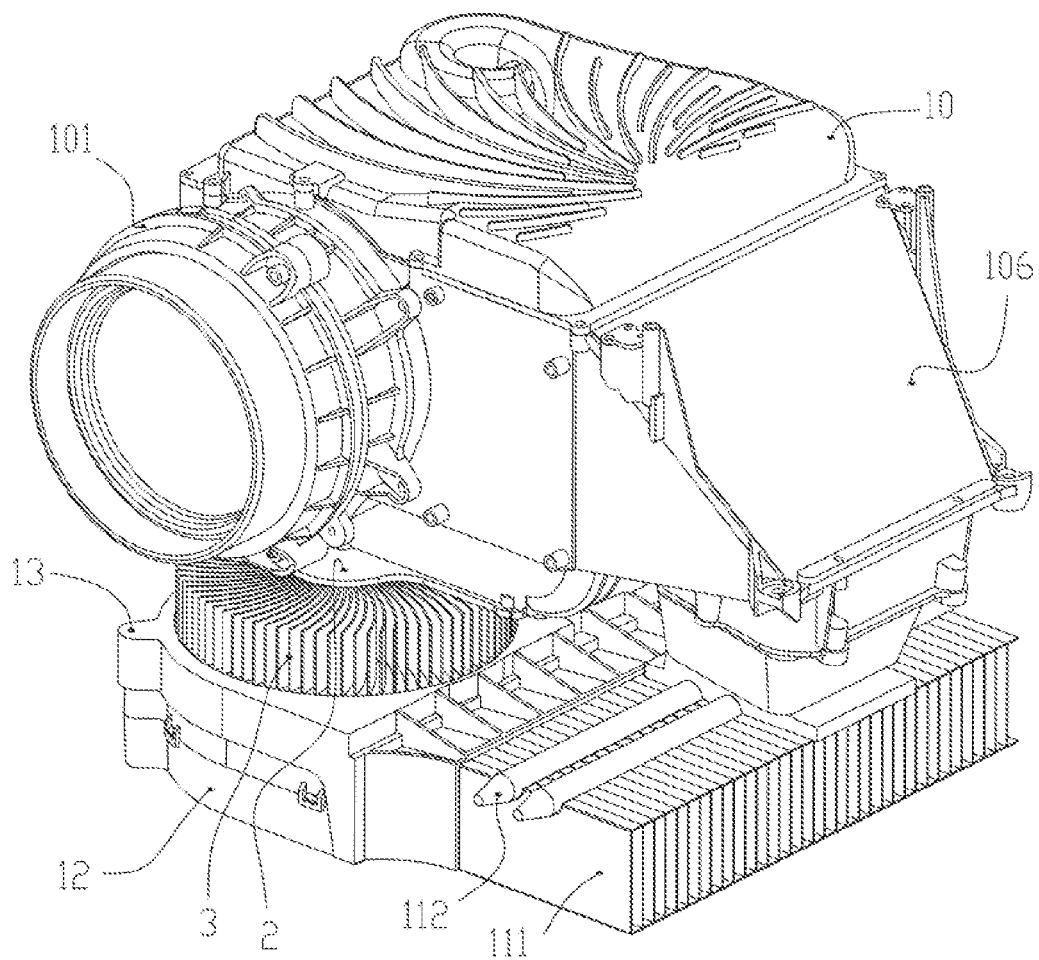
FIG. 3 is a display diagram of an outline of a fully sealed optical machine in the embodiment of the present invention.
Figure 4:
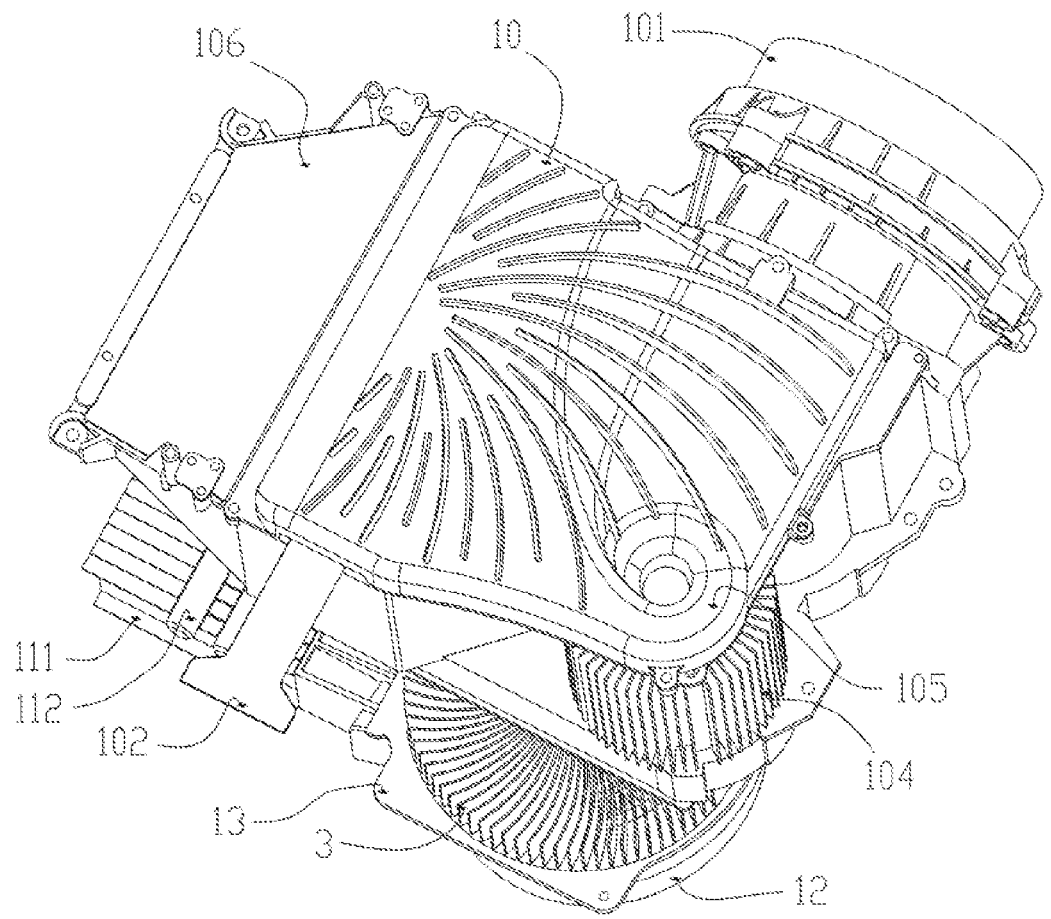
FIG. 4 is a display diagram of an outline of the fully sealed optical machine in the embodiment of the present invention from another angle.

The air guide cover 13 is used for sealing the interval between each external fan 12 and each sunflower sectional material 3 and correspondingly forms the trumpet-shaped first air channel 131 in an enclosing manner. As shown in FIG. 2, the number of the trumpet-shaped first air channels 131 is two, and the trumpet-shaped first air channels 131 correspond to the external fans 12 and the sunflower sectional materials 3 one to one. Since the enveloping outer diameter of a rib end of each sunflower sectional material 3 is selected artificially on purpose, which is greater than the diameter of the air inlet of each external fan 12, the trumpet-shaped air channels (in a funnel shape) are beneficial to formation of the air channels with excellent performance and sealing for the air channels; and due to the funnel shape, i.e. the design that cross sections of a pipeline are formed from big to small according to the flow direction of fluid, the separation of the fluid can be avoided more easily.

For the funnel, i.e. the trumpet-shaped air channel, at least about 1-2 mm of one end with big diameter is sleeved into the sunflower sectional material 3 (in the embodiment, the thickness of each sunflower sectional material 3 is about 18 mm-22 mm); one end of the funnel, which has the relatively smaller diameter, and the air inlet of each external fan 12 are opposite to each other and are pasted with each other; and the diameter of the flow section of the end part of the funnel is equal to or a little greater than the diameter of the air inlet of each external fan 12, which depends on the best design match of the air resistance of the funnel and the fan. Meanwhile, the air guide cover 13 is also used for sealing an interval between the air outlet of each external fan 12 and the LED light source radiator 11 and forming a second air channel 132 in an enclosing manner (with reference to FIG. 5), so as to prevent air short circuit and ineffective pressure diffusion. Finally, hot air flowing out of the LED light source radiator 11 is discharged to atmosphere through ventilation holes in the shell of the projector (not shown in the figure). Therefore, the external fans 12 can not only complete cooling for the efficient heat exchanger 14 and but also complete heat radiating for an LED light source of the projector, which serve multiple purposes, thereby facilitating reduction of the cost of the projector, decrease of the volume and reduction of the noise and controlling the cost performance of the product from a development end in a lean manner, so that the product design accords with positioning requirements as far as possible.

In the embodiment, the LED light source radiator 11 is preferably but not limited to a heat pipe radiator; and the LED light source radiator 11 comprises a heat absorption substrate (used for installing an LED light source 15), a heat pipe 112 and a Fin 111, which are structural general knowledge of the heat pipe radiator and are not repeated.

The fully sealed optical machine 10 of the embodiment can select the principle and technology of optics in the above Publication Number CN113156754A; and after an air return heat exchange technology in the above Publication Number CN113448156A is added, the design and the production are optimized. In FIG. 3-FIG. 5, 101 represents the projection lens; 102 represents an FPC (Flexible Printed Circuit) flat cable of the LCD light valve; 103 represents an internal fan (the number of internal fans is two in the figures) of the fully sealed optical machine 10; 104 represents the air return heat exchange pipe, and an air guide gyroscope is installed in the air return heat exchange pipe 104; 105 represents a drainage volute casing (the air return heat exchange pipe 104, the air guide gyroscope, the drainage volute casing 105 and the like can refer to the description of the Chinese patent with the Publication Number CN113448156A); and 106 represents an illumination reflecting mirror. The specific working principles of heat radiating of the cited technologies and the product structure can refer to patent literature of the above publication number. In the embodiment of the present invention, based on a heat radiating system of the above patent literature, the temperature of the LCD light valve is obviously lower than the temperature in the technologies of the above cited literature; an LED light source with higher power can be installed for the LED light source radiator 11; the product noise is lower, so as to allow the projector to output higher brightness and obtain better durability; and positive effects are achieved.

Figures 6, 7:
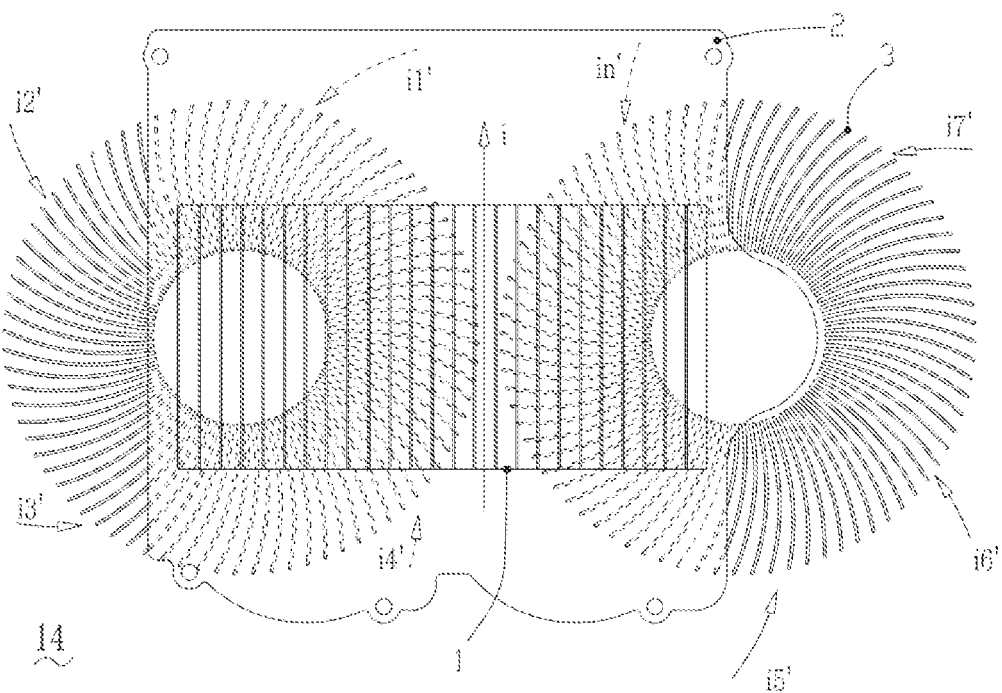
FIG. 6 is a schematic diagram of air channels of fluid of an efficient heat exchanger in the present invention.
FIG. 7 is a schematic diagram of a parallel-flow heat exchanger.

In order to further explain the innovation and the advancement of the present invention, continuing to refer to FIG. 7-FIG. 11: FIG. 7 is a structural schematic diagram of the parallel-flow form heat exchanger. In the figures, sur (surface) represents a partition plate of the heat exchanger; i represents fluid (corresponding to the fluid inside the optical machine of the present invention) at the relatively high temperature side of the heat exchanger; i' represents fluid (outside the optical machine) at the relatively low temperature side; Fin-A represents that the structure (for example) of a heat absorption part of the heat exchanger is a Fin, and Fin-B represents a Fin of a heat release part of the heat exchanger; TH-in represents the temperature that i flows into the Fin-A, and TH-out represents the temperature that i flows out of the Fin-A; and TL-in represents the temperature that i' flows into the Fin-B, and TL-out represents the temperature that i' flows out of the Fin-B.

Figure 8:
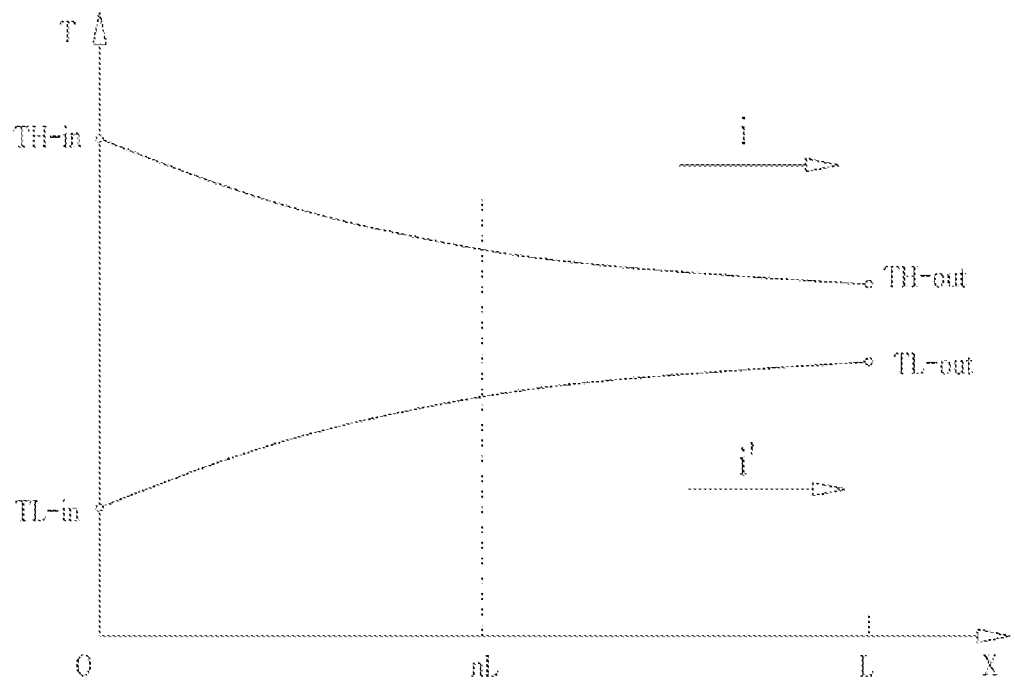
FIG. 8 is an analytical schematic diagram of FIG. 7.

It can be known from FIG. 7 that, since the Fin-A, the sur and the Fin-B are sequentially pasted to form a heat exchanger (module), the directions of the fluid i and i' are same. FIG. 8 is an analytical schematic diagram of parameters of a heat exchange system in FIG. 7. In FIG. 8, L can be understood as the equivalent length of the heat exchanger module formed by the Fin-A, the sur and the Fin-B, the origin of coordinates is correspondingly regarded as a flow-in part of i and i', and the abscissa L is correspondingly regarded as a flow-out part of i and i'.

With reference to FIG. 7, the heat is transferred (or exchanged) to the Fin-A by the fluid i (hot air) through forced convection, then the heat is transmitted to the sur by the Fin-A, and the heat is transmitted to the Fin-B by the sur; and through external forced convection, after the heat of the Fin-B is absorbed by the fluid i' (cold air), the heat is diffused into atmosphere. An infinitesimal section (or an infinitesimal surface) dx is selected randomly from 0-L; according to a heat transfer equation and a heat balance equation, after substitution and differentiation are performed on the equations (through combination with the application of the above LMTD method), it can be known that the heat transfer capability (or the heat transfer driving force) at dx is in direct proportion to a reciprocal value of the difference of natural logarithms of fluid temperature differences at an inlet and an outlet at dx, and the difference of the logarithms is equal to a logarithm of a result obtained after antilogarithms are divided. With reference to FIG. 8, as i and i' flow to the X direction, the temperature difference of TH-out and TL-out becomes smaller and smaller, and finally, TH-out and TL-out tend to be almost exactly the same, which means that when the antilogarithms of dx are divided, the denominator is zero, so that the algorithm is meaningless, and further, the heat exchange at dx of the heat exchanger is meaningless (or fails). Further, it can be known that even though the numerical value of L (the length) is further increased continuously, the heat transfer effect of the infinitesimal surface dx at the corresponding position tends to be zero, namely, the function of heat exchange is lost.

nL is a preferred length value that can be accepted or rejected when a product is designed specifically and represents the acceptance or rejection of specific data of the equivalent length of the heat exchanger. Generally, nL is determined by the production positioning, mainly comprising the factors such as the cost, the volume, the weight and the like; often, the length is sacrificed, and the cost can get benefit possibly, so as to obtain a rationality and a design balance. nL should be preferably selected at the position that the increment of a logarithm changing curve of the temperatures of i and i' is more obvious, and is unfavorably selected at the position approach to saturation (i.e. no increment).

Figure 9:
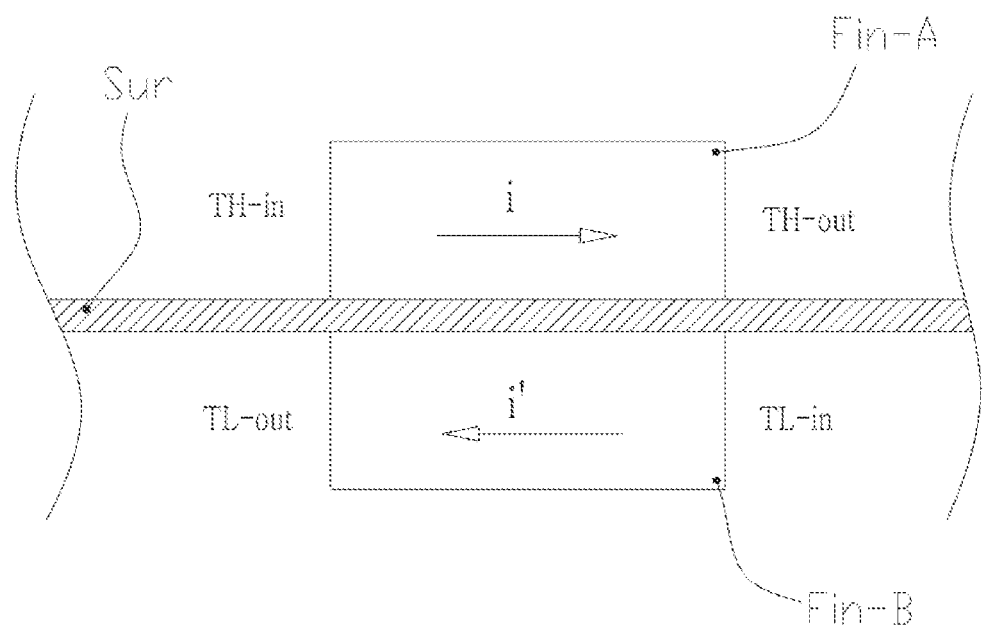
FIG. 9 is a schematic diagram of a counter-flow heat exchanger.
Figure 10:
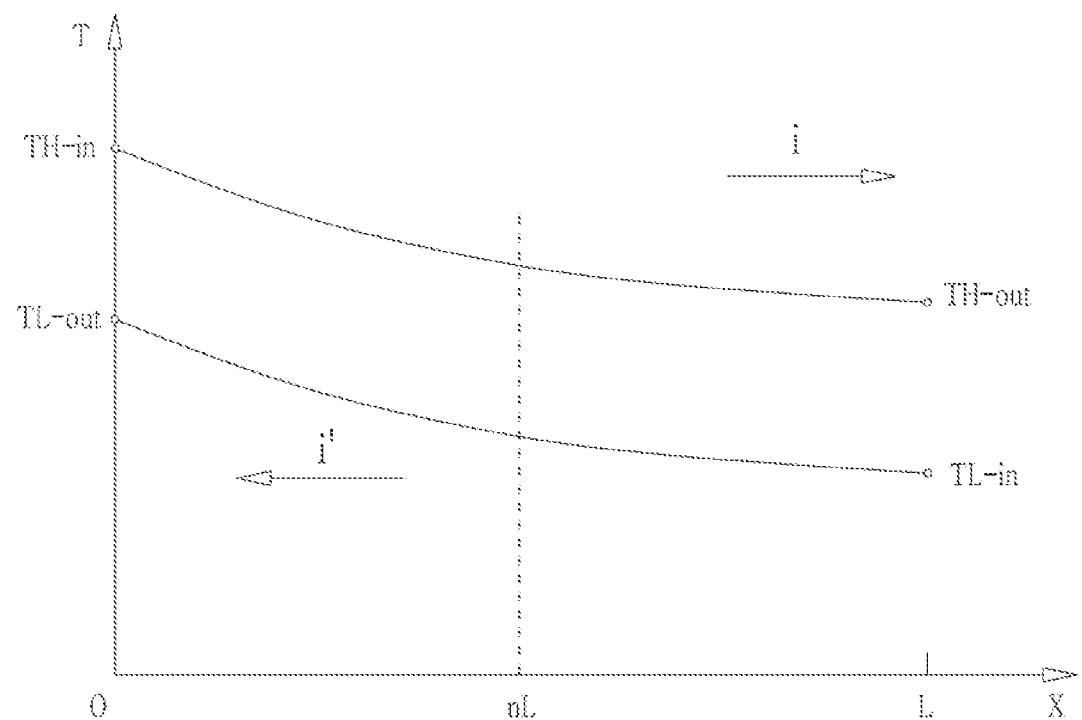
FIG. 10 is an analytical schematic diagram of FIG. 9.

With reference to a schematic diagram of a counter-flow heat exchanger as shown in FIG. 9, it is easy to see that the flowing directions of i and i' are opposite; and FIG. 10 is an analytical schematic diagram of parameters in FIG. 9. Relatively, the temperature difference of TH-out and TL-in and the temperature difference of TH-in and TL-out always exist and keep at relatively greater values, so the counter-flow heat exchanger shown in the figure has the relatively higher heat exchange efficiency. As described above, the heat distribution is sequentially reduced from the projection light source to the projection lens, so the heat exchanger is relatively difficult to be arranged inside the actual projector to radiate (exchange) the heat for the fully sealed optical machine.

Figure 11:
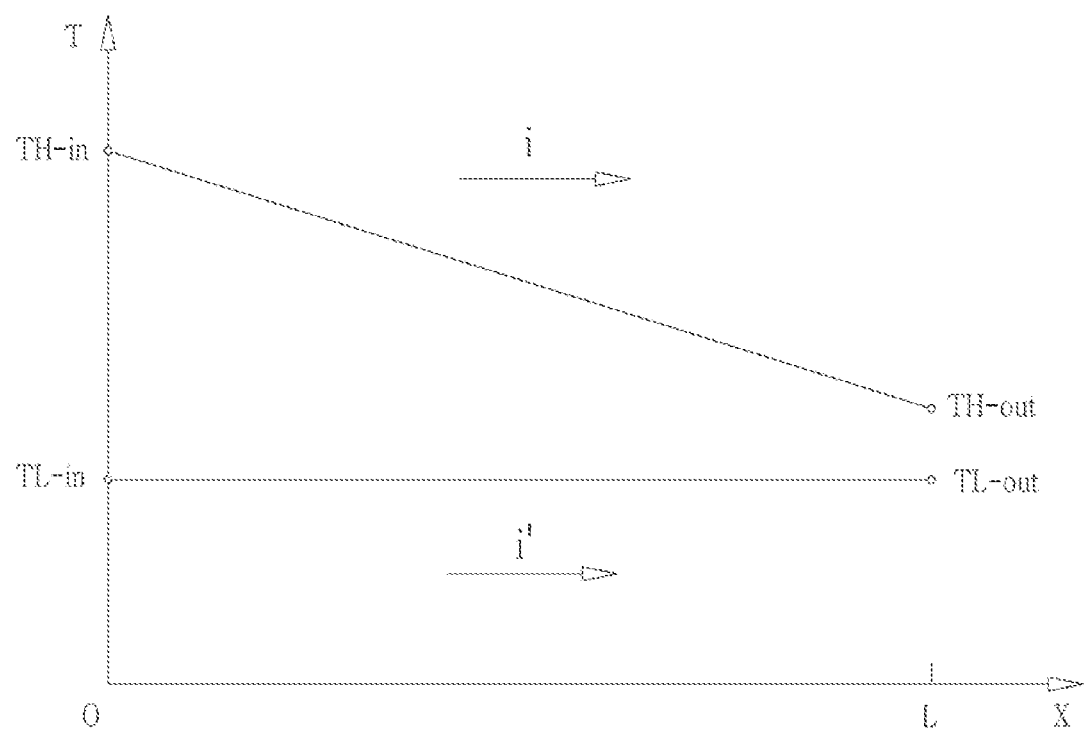
FIG. 11 is a schematic diagram of an ideal heat exchanger.

The two heat exchangers shown in FIG. 7 and FIG. 9 have limits in theories and engineering. For the heat radiating for the sealed optical machine of the projector, undoubtedly, an ideal heat exchanger shown in FIG. 11 is the best technical choice. However, the ideal heat exchanger is extremely difficult to exist in practice; and unless an additional energy source is used (such as a quench pump) for keeping i' at a constant low temperature state, the most efficient temperature reduction for i is realized. However, the technical methods which increase the cost, increase the complexity of the system, increase the production difficulty and the like are opposite to the development direction of the product and the industry.

Figure 12:
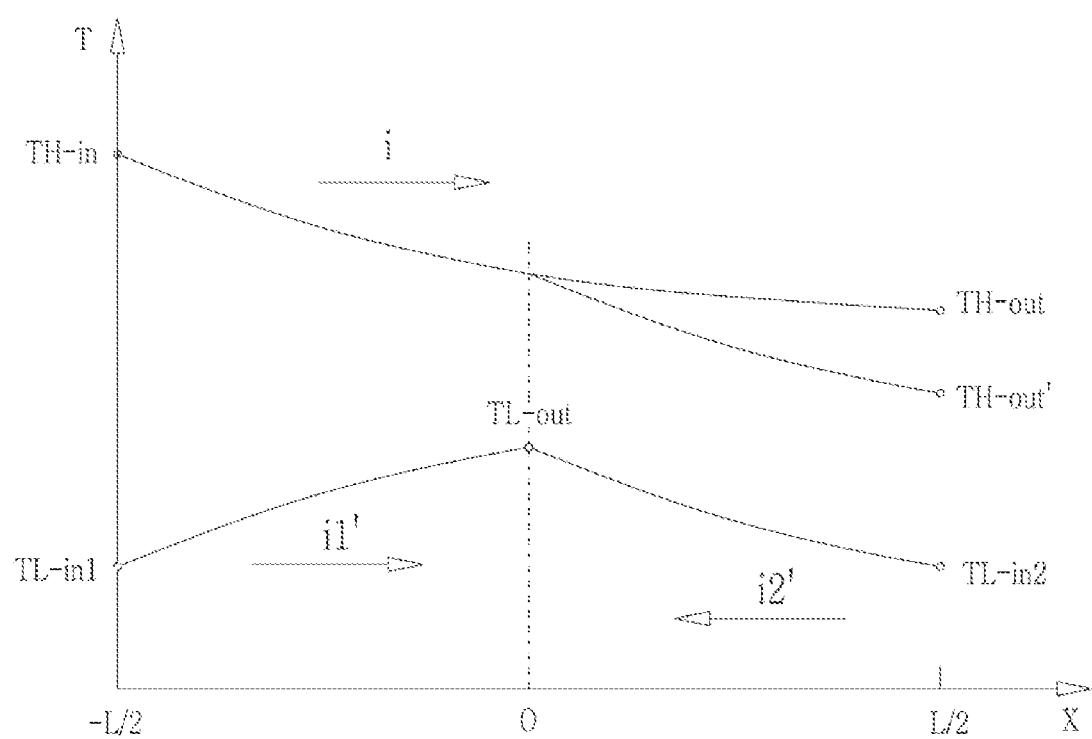
FIG. 12 is an analytical schematic diagram of FIG. 6 of the present invention.

As described above, only air flow i' at the low temperature side of the heat exchanger is kept at the constant low temperature state, the higher heat exchange efficiency can be obtained. In other words, on an infinitesimal surface selected randomly from 0-L, the temperature of the air flow i' at the low temperature side of the heat exchanger is unchanged, which can remarkably increase the total heat transfer coefficient of each infinitesimal surface, so that the temperature of air flow i at the high temperature side can be reduced faster. With reference to FIG. 6, the efficient heat exchanger 14 of the present invention comprises the buckled Fin 1, the partition plate 2 and the sunflower sectional materials 3 that are sequentially pasted; and in FIG. 6, the buckled Fin 1 (a solid line), the partition plate 2 (a solid line) and the sunflower sectional materials 3 (the positions sheltered by the partition plate 2 are dotted lines) face a human face sequentially. After the hot air flow i obtained after the force air-cooling heat radiation is carried out on the LCD light valve inside the fully sealed optical machine 10 flows through the buckled Fin 1, the heat is transferred to the buckled Fin 1, and then the heat is transmitted to the sunflower sectional materials 3 through the partition plate 2. With reference to FIG. 12, O is the equivalent center of the efficient heat exchanger 14 of the present invention, and L/2 and −L/2 are the equivalent lengths of the heat exchanger, which are symmetrical with the equivalent center point. On any infinitesimal surface (section) of the efficient heat exchanger 14 along the hot-cold heat transfer direction, for example, a curved surface, in which the rib surfaces of the sunflower sectional materials 3 are located, is an infinitesimal surface, obviously, TL-in of any infinitesimal surface is normal temperature and is the same; namely, TL-in of air flow $i1', i2', i3', i4', i5', i6', i7', \ldots, in'$ and the like at the heat release side has the maximum temperature difference from TH-in of the air flow i inside the optical machine, and then, the temperature reduction heat exchange effect close to the ideal heat exchanger shown in FIG. 11 is obtained. In FIG. 12, under equal conditions (such as the heat exchange area, the power, the flow rate and the like), TH-out' of the present invention is inevitably far below the value of TH-out of general heat exchangers, such as the parallel-flow heat exchanger, the counter-flow heat exchanger, the cross-flow heat exchanger and the like described in the above. Since the temperature difference of the fluid at the inlet and the outlet at any infinitesimal surface dx is possibly at a relatively most steep section in variations of the logarithmic curve theoretically, the temperature difference is maximum, which means that the heat exchanger is at a working state that the heat transfer driving force is highest. Here, nL can be understood as the equivalent center O of the efficient heat exchanger 14 of the present invention.

The above shows and describes the basic principles, main features and advantages of the present invention. Those skilled in the art shall understand that the present invention is not limited by the above embodiment. The above embodiment and the description merely illustrate the principle of the present invention. Various changes and improvements can also be made to the present invention without departing from the spirit and scope of the present invention, and shall fall into the protection scope of the present invention. The protection scope of the present invention is defined by the appended claims and equivalents.

I claim:

1. A heat radiating device of an LCD projector, the LCD projector having a fully sealed optical machine (10), wherein the heat radiating device comprises an LED light source radiator (11), an efficient heat exchanger (14), external fans (12) and an air guide cover (13); a window used for installing the efficient heat exchanger (14) is formed in the bottom of a shell of the fully sealed optical machine (10); the efficient heat exchanger (14) comprises a buckled Fin (1) at a high temperature heat absorption side, a partition plate (2) and sunflower sectional materials (3) at a low temperature heat release side, and the buckled Fin (1), the partition plate (2) and the sunflower sectional materials (3) are sequentially pasted; the buckled Fin (1) is located on an internal heat radiating air channel of the fully sealed optical machine (10); the partition plate (2) is used for sealing the window used for installing the efficient heat exchanger (14) and formed in the bottom of the shell of the fully sealed optical machine (10); air inlets of the external fans (12) are opposite to the sunflower sectional materials (3), and an interval is left between each external fan (12) and each sunflower sectional material (3); air outlets of the external fans (12) are opposite to the LED light source radiator (11); the air guide cover (13) is used for sealing the interval between the air inlet of each external fan (12) and each sunflower sectional material (3) and forming a first air channel (131) in an enclosing manner; the air guide cover (13) is used for sealing an interval between the air outlet of each external fan (12) and the LED light source radiator (11) and forming a second air channel (132) in an enclosing manner.

2. The heat radiating device of the LCD projector according to claim 1, wherein each external fan (12) is a turbofan.

3. The heat radiating device of the LCD projector according to claim 1, wherein the rib surface type of each sunflower sectional material (3) is in an involute spiral shape.

4. The heat radiating device of the LCD projector according to claim 1, wherein the involute spiral direction of the rib surface of each sunflower sectional material (3) is opposite to the rotation direction of each external fan (12).

5. The heat radiating device of the LCD projector according to claim 1, wherein the number of the sunflower sectional materials (3) is equal to the number of the external fans (12).

* * * * *